United States Patent [19]
Robb

[11] Patent Number: 4,529,860
[45] Date of Patent: Jul. 16, 1985

[54] PLASMA ETCHING OF ORGANIC MATERIALS

[75] Inventor: Francine Y. Robb, Tempe, Ariz.

[73] Assignee: Motorola, Inc., Schaumburg, Ill.

[21] Appl. No.: 403,995

[22] Filed: Aug. 2, 1982

[51] Int. Cl.³ .............................................. B23K 9/00
[52] U.S. Cl. ....................... 219/121 PE; 219/121 PF; 219/121 PG; 156/643; 156/646; 430/323; 430/313; 430/330
[58] Field of Search ................ 219/121 PD, 121 PE, 219/121 PG, 121 PF; 204/192 E; 156/643, 646, 345; 430/494, 323, 313, 314, 330

[56] References Cited

U.S. PATENT DOCUMENTS

| | | | |
|---|---|---|---|
| 4,201,579 | 5/1980 | Robinson et al. | 156/643 |
| 4,246,060 | 1/1981 | Keller | 156/646 |
| 4,278,753 | 7/1981 | Lewis et al. | 156/643 |
| 4,357,203 | 11/1982 | Zelez | 156/646 |
| 4,370,196 | 1/1983 | Vossen, Jr. et al. | 156/643 |
| 4,407,850 | 10/1983 | Bruce et al. | 204/192 E |

Primary Examiner—M. H. Paschall
Attorney, Agent, or Firm—John A. Fisher

[57] ABSTRACT

A method is provided for anisotropically etching organic material to reduce mask undercutting. The layer of organic material to be patterned, with an overlying patterning mask is provided on a substrate. The substrate with the layer of organic material on it is placed on the powered electrode within a plasma reactor. A hydrogen plasma is generated in the reactor at a pressure between about 13.3 Pa and about 53 Pa. The organic layer which is not protected by the etch mask is etched by the hydrogen plasma. At these pressures the organic layer is removed by a process of ion assisted etching in which the hydrogen plasma chemically reacts with the organic material and the reaction is enhanced by ionic bombardment of the plasma species. Because the substrate and the organic material are placed on the powered electrode, the plasma ions impact the surface of the organic layer in a direction substantially perpendicular to the surface of the layer thus providing anisotropy to the etch.

11 Claims, 9 Drawing Figures

PLASMA ETCHING OF ORGANIC MATERIALS

BACKGROUND OF THE INVENTION

This invention relates, in general, to a method for plasma etching organic materials and, more specifically, to a method for anisotropically etching organic materials in a hydrogen plasma.

The increasing complexity of semiconductor devices has required technological changes in the areas of materials, lithography, and processing. One such required change is the need for an anisotropic etch process for organic films. Two organic films which are now commonly used in semiconductor processing and which, in some applications, require anisotropic etching are, for example, polyimides and photoresist.

Polyimide is an organic material of increasing importance in semiconductor device processing because it possesses desirable dielectric and passivation properties. Current wet chemical as well as high pressure plasma etch processes for polyimide, however, produce lateral etching which, at best, is proportional to the vertical etch depth. The trend in semiconductor devices is towards smaller and smaller device geometries with closely spaced components and fine pattern sizes. As the device geometries continue to shrink, so also do the required openings which must be cut through the polyimide layers. The necessity for small closely spaced openings through polyimide layers requires an anisotropic polyimide etch process.

Two new process technologies which are becoming important are reactive ion etching and ion milling. Both of these processes require thick organic masking layers to pattern an etchable material because resist attack is so severe with these etch processes that it may be the limiting factor in determining the success or failure of the etch process. In addition, a thick resist is required in the process both for good step coverage and to minimize standing wave patterns caused by interference from reflected light. The need for thick resist layers is seemingly incompatible with high resolution and close dimensional control from a lithographic standpoint since the latter are usually best obtained in thin resist layers, typically less than 400 nanometers. One way to pattern the thick organic masking layer and to simultaneously maintain high resolution and dimensional control is to use a trilevel process. In that process a thick organic film of photoresist or polyimide is first applied to the substrate. The thick organic film will provide the ultimate masking layer and additionally serves to planarize the underlying substrate. Over the thick organic layer is applied an inorganic intermediate masking layer (a "hard" mask) and then a thin top layer of x-ray or e-beam photoresist. In using the trilevel process the top layer of photoresist is patterned in a desired fine geometry pattern. This in turn is used as an etch mask to pattern the hard mask. The hard mask is then used as an etch mask to pattern the thick organic layer. Etching the thick organic layer requires an anisotropic etch to replicate the pattern provided by the hard mask.

There are a number of ways to etch organic materials. It is well-known, for example, that organic films can be etched in an oxygen plasma; oxygen plasma etching or "ashing" of photoresist is common in the microelectronic industry. Ashing of a masked organic layer in an oxygen plasma, however, is an isotropic process resulting in severe undercutting of the mask material. Likewise, liquid etchants etch organic layers isotropically.

Reactive ion milling is known to be an anisotropic process with operating pressures on the order of $1.3 \times 10^{-2}$ Pa. The low pressure results in a longer mean free path and better ion directionality which achieve the anisotropy. Under such conditions organic layers can be etched anisotropically with little undercutting of the mask layer. In many applications of ion milling, however, severe attack of the mask material makes good line width control difficult. In addition, reactive ion milling is characterized by very low throughput and high system cost because of the low vacuums required.

In view of the need for a process for anisotropically etching organic films and further in view of the difficulties associated with present anisotropic etching methods, a need existed for an improved anisotropic etch process.

It is therefore an object of this invention to provide an improved method for anisotropically etching organic films.

It is another object of this invention to provide an improved method for etching organic films without high vacuum equipment.

It is a further object of this invention to provide an improved method for etching openings of predetermined sidewall contour through a layer of organic material.

It is yet another object of this invention to provide an improved method to etch openings in an organic layer without undercutting the etch mask.

BRIEF SUMMARY OF THE INVENTION

The foregoing and other objects and advantages are achieved in accordance with the invention through the use of a hydrogen plasma etch technique. A layer of organic material to be etched is provided on a suitable substrate and a patterned mask having the desired etch pattern is provided over the organic material surface. The substrate with the organic layer and mask thereon is placed in a plasma reactor and positioned substantially parallel to and electrically coupled with a cathode electrode within the reactor. The organic layer is maintained at a temperature below that which will cause the patterned mask to flow. The pressure in the reactor is reduced and then maintained at a pressure below about 53 Pa. A plasma is generated within the reactor with the plasma species including hydrogen and not more than a small amount of oxygen. The portion of the organic layer exposed through the etch mask is anisotropically etched by reacting the hydrogen plasma species with the organic material. After a predetermined amount of the organic layer is removed, plasma etching is terminated.

DETAILED DESCRIPTION OF PREFERRED EMBODIMENTS

Figure 1:
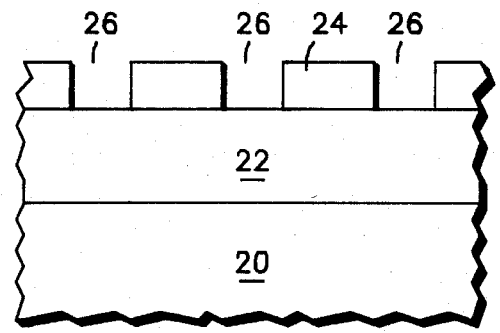
FIG. 1 illustrates a semiconductor structure including an organic layer.

FIG. 1 illustrates a typical structure encountered in the semiconductor technology. Overlying a substrate 20 is an organic layer 22. It is necessary, in the fabrication of some desired structures, to etch the organic layer in some predetermined pattern. A masking layer 24, normally an inorganic material, is provided over the organic layer in order to obtain the desired pattern. The openings 26 in mask layer 24 illustrate a pattern that it is desired to replicate in the underlying organic layer 22.

Figure 2:
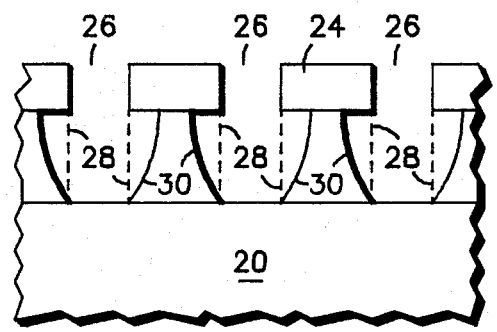
FIG. 2 illustrates the effect of etching an organic layer with an isotropic etchant.

FIG. 2 illustrates the undercutting of mask layer 24 which results when layer 22 is isotropically etched, for example, in a high pressure plasma or wet etchant. Instead of etching through the organic layer 22 and replicating the openings 26 in mask layer 24 as indicated by the dotted lines 28, the conventional isotropic etchants also etch horizontally undercutting the mask as the vertical etching proceeds through the organic material. As a result the openings etched in the organic layer do not have vertical sides replicating the mask openings, but instead have tapered sidewalls as indicated at 30. The width of the resultant opening is also difficult to control in such a process and often is greater than the mask opening.

Figure 3:
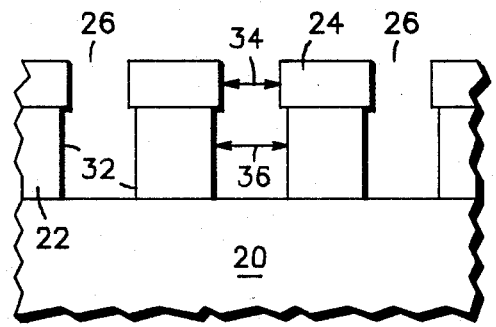
FIG. 3 illustrates anisotropic etching of an organic layer in accordance with the invention.

FIG. 3 illustrates the result of anisotropically etching organic layer 22 in accordance with the invention. A patterned etch mask 24 overlies an organic layer 22 which is provided on a substrate 20. Openings 26 in the etch mask are replicated in the underlying organic layer. Etching the organic layer, in accordance with the invention, in a hydrogen plasma at a pressure between about 13.3 Pa and about 53 Pa results in nearly vertical sidewalls 32. Additionally, the width 34 of the opening in the etch mask is replicated by the width 36 of the opening in the organic layer. The amount of undercutting, that is, the amount by which width 36 exceeds width 34 is minimal.

Figure 4:
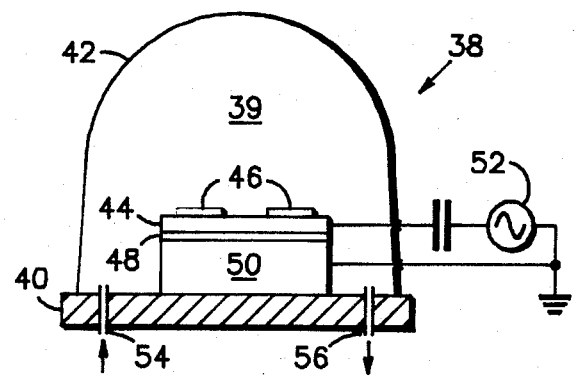
FIG. 4 illustrates plasma reactor apparatus for carrying out the invention.

FIG. 4 illustrates a plasma reactor apparatus 38 in which the process in accordance with the invention is carried out. Reactor 38 includes a reaction volume 39 which is bounded, in this embodiment, by a base plate 40 and a bell jar 42. Within the reaction volume is a substantially planar RF plasma cathode 44 upon which substrates 46 can be placed. A quartz plate 48 separates the cathode from an anode 50 and limits the plasma discharge to the upper surface of the cathode. The cathode is powered by an RF generator 52; the anode is held at RF ground. An input 54 and exhaust 56 allow the injection of reactants and the removal of reaction products, respectively. For purposes of practicing the invention, it is necessary only that the cathode be located within the reaction volume, that the substrates to be etched be placed substantially parallel to that cathode, and that the substrates be electrically coupled, e.g., capacitively coupled, to the RF cathode. The substrates do not have to physically contact the cathode, although it may be convenient to do so. The reactor apparatus can otherwise have a variety of different configurations without influencing the anisotropic etching process.

The following are non-limiting examples which further serve to illustrate the invention and to point out the best modes contemplated by the inventor.

EXAMPLE I

Samples are prepared by growing about 1.0 micrometer of thermal oxide on a polished silicon substrate. A thick organic film is formed over the thermal oxide on one side of the substrate. Organic films are formed having thicknesses ranging from about 0.5 micrometer to about 3.0 micrometer with a typical thickness of about 1.5 micrometer. The organic films include polyimides such as PI 2545 made by DuPont and conventional photoresists such as HR-100 and HPR-206 made by the Hunt Chemical Company. Over the organic layer is deposited a hard mask layer of either plasma deposited silicon nitride or plasma deposited silicon oxide having a thickness of about 120–150 nanometer. Finally, a layer of e-beam resist is deposited on the surface of the hard mask. The e-beam resist is patterned using e-beam lithography and then is used as an etch mask to reactive ion etch the hard mask layer using $CF_4$ or $CHF_3$ to etch the nitride or oxide, respectively.

Masked organic layers as prepared above are plasma etched at pressures ranging from about 13 Pa to about 66.5 Pa to measure etch rate and anisotropy or degree of undercutting. The lower pressure limit is selected because that pressure is one readily obtainable in conventional plasma reactor equipment without sophisticated and expensive vacuum pumping equipment. Still lower pressures are difficult to obtain and involve typical problems of high vacuum systems including more complex pumping equipment, greater expense, and lowered throughput. Samples are etched in both a pure hydrogen and in a pure oxygen plasma at 150 watts RF total power or 0.34 watts/$cm^2$. Substrates are at room temperature and are heated above room temperature only by the heat produced in the plasma reaction.

Figure 5:
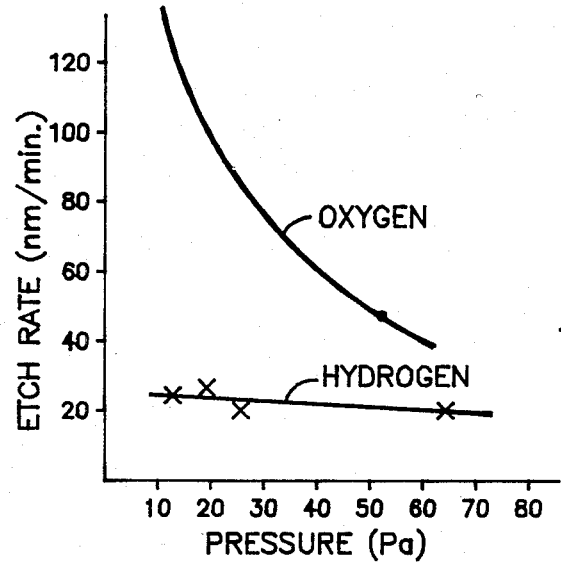
FIG. 5 illustrates etch rate as a function of pressure in hydrogen and oxygen plasmas.

FIG. 5 illustrates the measured etch rate found as a function of pressure. The etch rate in the hydrogen plasma is essentially independent of pressure over the range investigated. In contrast, the oxygen etch rate is highly pressure dependent with the etch rate increasing rapidly as the pressure is lowered.

There are two possible explanations for the oxygen plasma etch rate dependence on pressure. First, the increasing organic film etch rate as pressure is lowered suggests that ion bombardment aids the oxidation process. Since the energy of the bombarding ions increases as pressure decreases, the etch rate increases as pressure is lowered. Alternatively, the etch rate dependence may be a function of residence time effects. In the reactor used in this Example, the average residence time of plasma species in the discharge increased as the pressure decreased. An increase in residence time allows a more complete reaction of the plasma species with the organic material resulting in an increased etch rate.

Because the etch rate of the organic film in the hydrogen plasma changes little with pressure, the hydrogen plasma etch mechanism in this pressure regime is apparently quite different than the etch mechanism for the oxygen plasma. It appears that ion bombardment and residence time effects on etch rate are minimal in the hydrogen plasma process.

In etching through the organic film layer to the underlying silicon dioxide, each sample is given a 10% overetch, consistent with usual semiconductor processing practice. Each sample is examined using a scanning electron microscope (SEM) to determine the amount of undercutting that has occurred. With the oxygen plasma a significant amount of undercutting occurs at all pressures investigated with a slight increase in undercutting as the pressure is increased. In contrast, no undercutting is observed for samples etched in the hydrogen plasma for pressures less than or equal to about 53 Pa. Only at pressures greater than about 53 Pa is significant undercutting observed.

It is believed that both oxygen and hydrogen plasmas have two "modes" of etching. One mode is chemical in nature, and this mode dominates at high pressures and results in some horizontal etching or undercutting of the etch mask. The second mode, which is more physical in nature, is controlled by ion bombardment. This ion assisted mode dominates at low pressures and results in anisotropic etching. The transition from the chemical to the physical mode occurs at different pressures for hydrogen and oxygen plasmas. The transition pressure for oxygen lies somewhere between the 13 Pa investigated above and about $1.3 \times 10^{-2}$ Pa at which reactive ion milling is practiced. The transition pressure for hydrogen plasma is higher, about 50 Pa. Below the transition pressure purely anisotropic processes dominate. Above the transition pressure, isotropic components appear and dominate as the pressure is further increased. Anisotropic etching in a hydrogen plasma can therefore be practiced without expensive vacuum equipment at pressures between about 13 Pa and about 53 Pa.

EXAMPLE II

Figure 6:
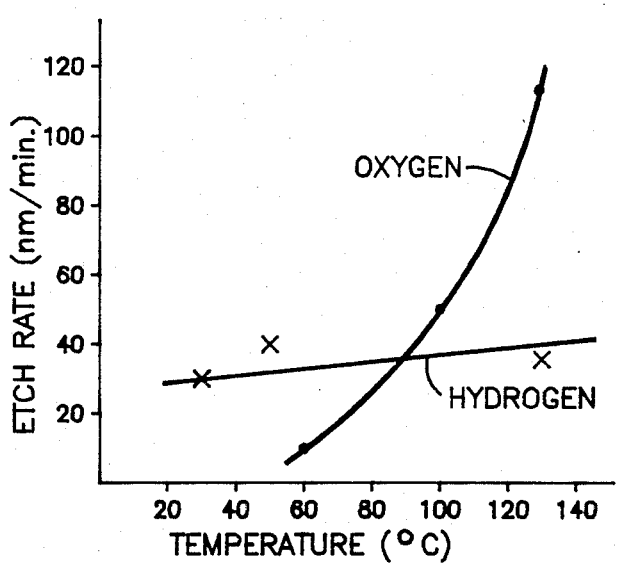
FIG. 6 illustrates etch rate as a function of temperature in hydrogen and oxygen plasmas.

Polyimide samples are prepared as in Example I. These samples are etched in either an oxygen plasma or in a hydrogen plasma at a pressure of about 20 Pa at 150 watts RF power (0.34 watts/cm$^2$). The temperature of the substrates in the reactor is varied from about room temperature to about 130° C. FIG. 6 illustrates how the etch rate of the organic layer in both oxygen and hydrogen plasmas varies as the temperature changes. The etch rate in the hydrogen plasma changes very little as the temperature increases. In contrast, the etch rate in the oxygen plasma increases rapidly with temperature. Arrhenious plots of the data for both hydrogen and oxygen plasma etching suggest different etch mechanisms for the two plasma systems in this temperature range. The samples etched in the oxygen plasma show significant undercutting. The samples etched in the hydrogen plasma showed no substantial undercutting throughout the temperature range investigated. Previous experiments, such as those disclosed in U.S. Pat. No. 4,201,579 indicate that when etching isotropically in a barrel type plasma reactor the etch rate of organic materials in a hydrogen plasma increases dramatically if the temperature is raised above about 150° C. In those experiments, however, the intent was to completely remove the layer of organic material. In accordance with the present invention, in which an organic layer is anisotropically etched to provide a well-defined pattern in a residual portion of the organic layer, the temperature must be limited to about 130° C. to avoid flowing of the top level resist.

EXAMPLE III

Figure 7:
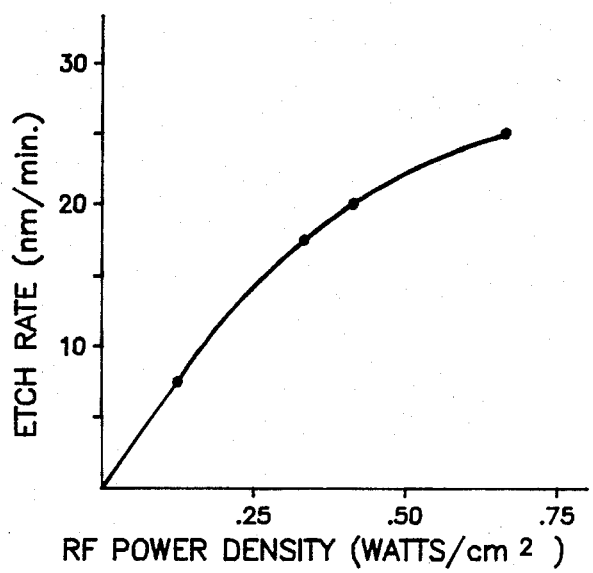
FIG. 7 illustrates etch rate of photoresist in a hydrogen plasma as a function of RF power.

Samples are prepared as in Example I. The samples are etched in a hydrogen plasma at about 20 Pa at room temperature. For different samples the RF power is varied up to about 0.68 watts/cm$^2$. Representative data for one set of samples in which the organic layer is HR-100 photoresist are shown in FIG. 7. Similar etch rate characteristics are found for HR-100, polyimide and positive resists. The increasing etch rate is believed to be the result of increased reactive species production and/or enhanced ion bombardment energy.

EXAMPLE IV

Samples are again prepared as in Example I. In an attempt to increase the etch rate of the organic material without adversely affecting the anisotropy, oxygen is added to the hydrogen plasma. The etch rate of the organic material is found to increase approximately linearly with oxygen concentration in the hydrogen plasma. Substantial undercutting, however, is noted when the oxygen content of the mixed hydrogen-oxygen plasma exceeds about 8%. For oxygen content less than about 8% no substantial undercutting is noted. It appears that the mixed hydrogen-oxygen plasmas show an additive result. The purely chemical oxygen etch mode is superimposed on the ion assisted hydrogen etch mode. The result is some horizontal etching combined with vertical etching with the exact amount of horizontal etching being controlled by the oxygen percentage.

EXAMPLE V

Figure 8:
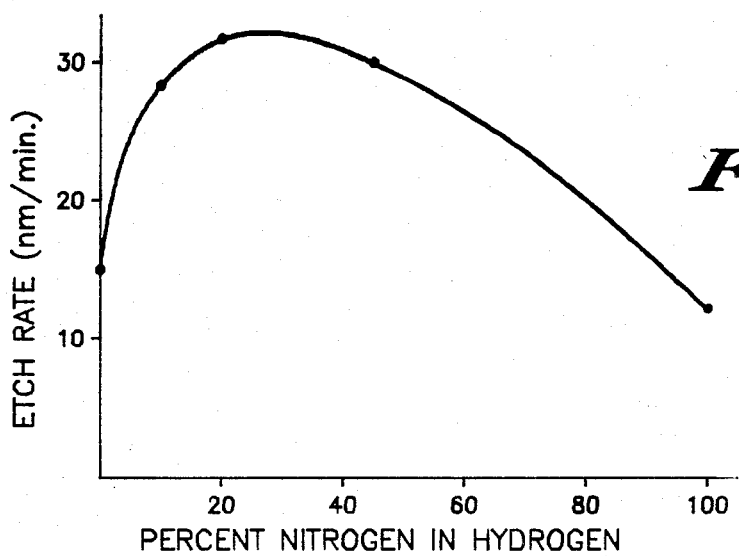
FIG. 8 illustrates etch rate of polyimide in a hydrogen-nitrogen plasma as a function of nitrogen percentage.

Samples are prepared as in Example I. The samples are etched in a mixed hydrogen-nitrogen plasma. FIG. 8 illustrates etch rate results obtained when polyimide layers are etched in the mixed plasma at a pressure of about 20 Pa at 0.45 watts/cm$^2$ RF power. The etch rate of the polyimide layer increases with nitrogen percentage in the mixed plasma to about 40% nitrogen and then decreases with further additions of nitrogen. The samples are anisotropically etched without substantial undercutting.

The etch rate in the mixed hydrogen-nitrogen plasma is higher than the etch rate in either hydrogen or nitrogen alone. No substantial amount of undercutting is observed for any mixture of hydrogen and nitrogen under these conditions. With hydrogen alone, the dominating reaction is proposed to be:

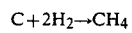

$$C + 2H_2 \rightarrow CH_4$$

which forms methane as the principal product. In nitrogen alone the dominant product is believed to be cyanogen by the reaction:

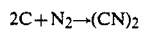

$$2C + N_2 \rightarrow (CN)_2$$

In addition to methane and cyanogen, a third product, hydrogen cyanide may be produced when both hydrogen and nitrogen are present. It is the possible presence of the hydrogen cyanide which may explain the higher etch rate in the mixed hydrogen-nitrogen plasma than in either of the pure plasmas.

The enhanced etch rate without undercutting indicates that both hydrogen and nitrogen plasma etch by an ion assisted etch mechanism under these conditions.

EXAMPLE VI

Samples are prepared as in Example I. The organic layer is plasma etched in a mixture of hydrogen and argon. The argon addition does little to increase the etch rate of the organic material. The argon appears to act only as a diluant of the hydrogen plasma; apparently the purely physical ion bombardment by argon species is unimportant at these powers and pressures.

EXAMPLE VII

In certain applications it is desirable to be able to etch an opening through a thick organic film in such manner that the sidewall openings have a predetermined taper. One such instance, for example, is when a subsequent metallization layer must be deposited over a polyimide layer and make contact through an opening to an underlying material. Tapered openings in the polyimide aid in assuring good step coverage as the metal passes from the top of the polyimide to the underlying material.

Figure 9:
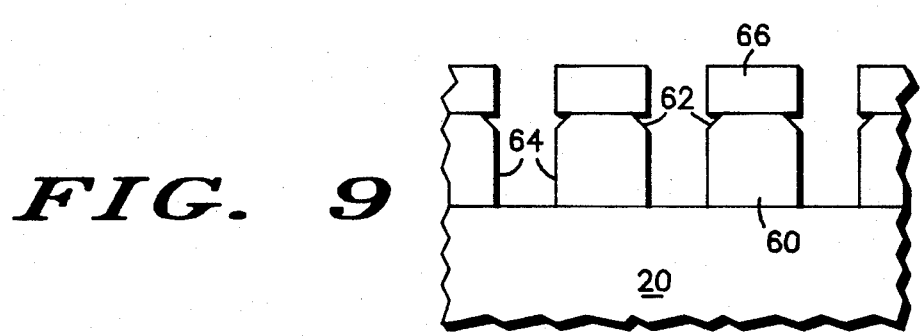
FIG. 9 illustrates results of etching an organic layer in a two-step process in accordance with the invention to achieve openings in the layer having a predetermined sidewall contour.

Samples are prepared as in Example I. A two-step process is then used to produce an opening having tapered walls and controlled size in the thick organic layer. In the first step the organic layer is isotropically etched in an oxygen plasma through the first portion of the thickness of the organic film. In the second step the substrates are etched in a low pressure hydrogen containing plasma as in Example V to etch through the remainder of the organic film. The first step in the etching is an isotropic etch which produces undercutting of the hard mask. The second step is an anisotropic ion assisted etch which causes the lower portion of the opening to be the same size as the opening in the hard mask. FIG. 9 illustrates the result of etching a polyimide film 60 of about 2.2 micrometers thickness by the two-step etch process. The first about 0.8 micrometers of the film are isotropically etched in step one resulting in an undercut, sloped edge 62. The remainder of the film thickness is etched anisotropically in step two to yield a straight walled portion 64. The amount of tapering is controlled by the percentages of film thickness etched in each of the two etch steps. After etching, the hard mask 66 is removed to expose the patterned organic layer.

In the foregoing examples substrates were generally placed on the cathode within the plasma reactor apparatus. It is not necessary, however, that the substrates actually contact the cathode physically; the wafers must be electrically coupled to the cathode. It is believed that ion assisted etching takes place by hydrogen species which arrive at the cathode approximately normal to the cathode surface. To take advantage of this ion assisted etching and to achieve anisotropic etching the substrates are placed substantially parallel to the cathode surface.

Thus it is apparent that there has been provided, in accordance with the invention, an anisotropic etching process which fully meets the objects and advantages set forth above. While the invention has been described with respect to specific embodiments thereof, it is not intended that the invention be so limited. Those skilled in the art, after review of the foregoing description, will realize that certain variations and modifications are possible while still realizing the full benefit of the invention. These include, for example, variations in the structure to be etched, and modifications to the reactor apparatus. Other materials which do not have a volatile hydride and thus exhibit etch selectivity over the organic layer can be used as a hard mask. It is intended that all such variations and modifications be included within the scope of the appended claims.

I claim:

1. A method for anisotropically patterning a layer of organic material which comprises the steps of: providing a substrate having thereon a layer of organic material to be anisotropically patterned; providing a patterned mask overlying said layer; providing a plasma reactor having a reaction volume characterized by a pressure and having an electrode therein; positioning said substrate in said reaction volume substantially parallel to and electrically coupled to said electrode; maintaining the temperature of said substrate at a temperature less than that required to cause flowing of said patterned mask; reducing said pressure in said reaction volume and maintaining said pressure at less than about 53 Pa; generating a plasma in said reaction volume, the plasma species in said plasma comprising hydrogen; anisotropically removing a portion of said organic layer not protected by said patterned mask by reacting said plasma with said portion; and stopping said generating of said plasma after removing a predetermined amount of said layer but before removing all of said layer.

2. The method of claim 1 wherein said plasma species further comprises nitrogen.

3. The method of claim 2 wherein said plasma species comprises hydrogen and 0–40 percent nitrogen.

4. The method of claim 1 wherein said plasma species comprises hydrogen and 0–8 percent oxygen.

5. The method of claim 1 wherein said electrode is an RF cathode.

6. The method of claim 5 wherein said step of positioning comprises placing said substrate on said cathode electrode.

7. The method of claim 1 wherein said temperature of said substrate is less than about 130° C.

8. The method of claim 1 wherein said pressure in said reactor is between about 13.3 Pa and about 53 Pa.

9. A method for patterning a layer of organic material to form an opening through said layer having tapered sidewalls and controlled size which comprises the steps of: providing a layer of organic material to be patterned, said layer having a thickness and having a surface; providing a patterned mask on said surface; first isotropically etching a portion of said layer of organic material exposed through said patterned mask, said etching continuing through some but not all of said thickness to form an initial part of said opening having tapered sidewalls; and then anisotropically etching said portion of said layer exposed through said patterned mask to complete etching through said thickness to form a final part of said opening having substantially vertical sidewalls and having a size determined by said patterned mask.

10. The method of claim 9 wherein said step of isotropically etching comprises etching in an oxygen plasma.

11. The method of claim 9 wherein said step of anisotropically etching comprises positioning said layer of organic material in a plasma reactor with the surface of said layer substantially parallel to a RF plasma cathode within said reactor; and etching in a hydrogen containing plasma at a pressure of about 13.3 to 53 Pa and at a temperature of less than about 130° C.

* * * * *